(12) United States Patent
Yang et al.

(10) Patent No.: US 8,743,537 B2
(45) Date of Patent: Jun. 3, 2014

(54) AIRFLOW ADJUSTMENT DEVICE AND BLADE SERVER

(75) Inventors: Wen-Hsiung Yang, Taipei Hsien (TW);
Wei-Chung Hsiao, Taipei Hsien (TW);
Shih-Huai Cho, Taipei Hsien (TW);
Ming-Chang Wu, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 155 days.

(21) Appl. No.: 13/491,181

(22) Filed: Jun. 7, 2012

(65) Prior Publication Data

US 2013/0033815 A1 Feb. 7, 2013

(30) Foreign Application Priority Data

Aug. 4, 2011 (TW) .............................. 100127780 A

(51) Int. Cl.
*H05K 7/20* (2006.01)
*G06F 1/20* (2006.01)

(52) U.S. Cl.
USPC .............. 361/679.46; 361/679.49; 361/679.5; 361/690; 361/694; 361/695; 361/715; 165/80.3; 165/121; 165/122; 165/126; 165/104.33; 454/184; 312/223.1

(58) Field of Classification Search
USPC .............. 361/679.46–679.51, 690–697, 715, 361/719–722, 724–727, 730, 752, 831; 165/80.2, 80.3, 104.33, 121–126, 185; 174/17 R, 50, 53, 56–58, 520, 592; 454/183, 184, 333, 358; 312/223.1, 312/223.2, 223.3, 308, 310, 321.5, 351.2, 312/336, 362
See application file for complete search history.

(56) References Cited

U.S. PATENT DOCUMENTS

| | | | |
|---|---|---|---|
| 6,556,438 B1 * | 4/2003 | Bolognia et al. | 361/679.48 |
| 6,920,049 B2 * | 7/2005 | Brooks et al. | 361/727 |
| 6,958,906 B2 | 10/2005 | Wu et al. | |
| 7,167,363 B1 * | 1/2007 | Cushman et al. | 361/694 |
| 7,391,618 B2 * | 6/2008 | Fujiya et al. | 361/727 |
| 7,619,897 B2 * | 11/2009 | Della Fiora et al. | 361/724 |
| 7,652,891 B2 * | 1/2010 | Lucero et al. | 361/752 |
| 7,817,430 B2 * | 10/2010 | Sherrod et al. | 361/724 |
| 7,929,295 B2 * | 4/2011 | Joshi | 361/679.5 |
| 2005/0286222 A1 * | 12/2005 | Lucero et al. | 361/690 |
| 2007/0207720 A1 * | 9/2007 | Henry et al. | 454/184 |
| 2008/0117589 A1 | 5/2008 | Carrera et al. | |
| 2011/0085296 A1 * | 4/2011 | Rubenstein et al. | 361/679.47 |

FOREIGN PATENT DOCUMENTS

TW M388202 U1 9/2010

* cited by examiner

*Primary Examiner* — Michail V Datskovskiy
(74) *Attorney, Agent, or Firm* — Muncy, Geissler, Olds & Lowe, P.C.

(57) ABSTRACT

An airflow adjustment device is disclosed. The airflow adjustment device is used for a blade server provided for plugging in an interface card, and the interface card includes a bracket. The airflow adjustment device is installed in the blade server, and the airflow adjustment device includes a top cover, a plurality of sidewalls, a bracket plate, and at least one deflector. The bracket plate is used for sheltering the bracket, and air enters the blade server through the at least one deflector and at least one gap area formed by the bracket plate and at least one of the plurality of sidewalls whereby the flow resistance of the blade server is not affected by the type of the bracket.

10 Claims, 9 Drawing Sheets

AIRFLOW ADJUSTMENT DEVICE AND BLADE SERVER

BACKGROUND OF THE INVENTION

1. Field of the Invention

The present invention relates to an airflow adjustment device and a blade server, and more particularly, to an airflow adjustment device and a blade server for reducing the variation of flow resistance generated due to different forms of an interface card or a bracket thereof.

2. Description of the Prior Art

In response to the rapid growth of cloud computing in recent years, the application for PCI-E interface cards in blade servers are also widespread and diverse. The blade servers are integrated into an integration cabinet for centralization to provide power, heat dissipation and network communication. The method for cooling each blade server is to use a fan subsystem to eliminate heat generated by the blade servers by pulling in or discharging air, so greater airflow for each blade server correlates to better heat dissipation. In order to provide the host computer of the system enough airflow for cooling, the current method for controlling flow distribution is to use the average matching of parallel impedance of each blade server under constant volume, and therefore the flow resistance design needs to consider not only the cooling problem in each blade server but also the wind flow balance between all the different forms of blade server to prevent any blade servers from overheating. Because the bracket of each PCI-E interface card has a different holes structure, the holes of the bracket seriously affect flow resistance. Therefore, in addition to the flow resistance of the interface card, the geometry hole open rate at the bracket diversifies the range of the flow resistance and makes effective control of the flow resistance of the PCI-E interface card in the blade server more difficult.

FIG. 1A presents a schematic view of a blade server system of the prior art. The blade server system 2a includes a plurality of blade servers 20a, and there are fans for ventilation in the back of the plurality of blade servers 20a. Outside air is drawn in via each opening in front of the blade servers 20a to cool each blade server 20a. In normal circumstances, each blade server per unit area should receive the same air mass flow rate. However, as shown in FIG. 1B, when the blade servers 20a are provided for plugging a PCI-E interface card 3a,3b, the shape and quantity of the bracket openings 311a of the bracket 31a of the PCI-E interface card 3a and the bracket openings 311b of the bracket 31b of the PCI-E interface card 3b may not be the same, and some of the brackets 31 of the PCI-E interface card may not include the bracket openings, all of which affect the per unit mass flow rate of air in the blade servers 20a, such that the heat dissipation in each blade server 20a in the blade server system 2a is non-uniform.

Accordingly, it is imperative to provide an airflow adjustment device and blade server to overcome the drawbacks of the prior art.

SUMMARY OF THE INVENTION

It is a primary objective of the present invention to provide an airflow adjustment device and a blade server.

The airflow adjustment device of the present invention is applied in the blade server, which includes a housing and a circuit board, and the housing includes a connecting part and at least one intake area; the at least one intake area is positioned on at least one side of the connecting part; the circuit board is set in the housing and includes an expansion slot provided for plugging in an interface card, wherein the interface card includes a bracket demountably connected with the connecting part.

The airflow adjustment device includes a top cover, a plurality of sidewalls, a bracket plate, and at least one deflector. The plurality of sidewalls are extended from two sides of the top cover, wherein the top cover and the plurality of sidewalls can hold the interface card; the bracket plate is extended from a front side of the top cover and positioned in front of the top cover to shelter the bracket, wherein the width of the bracket plate is substantially not larger than that of the top cover, and the bracket plate and at least one of the plurality of sidewalls form at least one gap area; the at least one deflector is outward extended from one of the plurality of sidewalls and used to guide air flowing through the at least one gap area and entering the airflow adjustment device. The airflow adjustment device is set in the blade server system when the interface card is plugged in the expansion slot, and the interface card is positioned in the airflow adjustment device, thereby allowing a flow resistance of the blade server not to be affected by the form of the bracket when air enters the airflow adjustment device via the at least one intake area, at least one deflector, and the at least one gap area.

The blade server of the present invention is used to provide for installing the interface card, wherein the interface card includes a bracket, and the blade server includes a housing, a circuit board, and an airflow adjustment device. The housing includes a connecting part and at least one intake area, and the at least one intake area is positioned on at least one side of the connecting part; the circuit board is set in the housing and includes an expansion slot provided for plugging in the interface card, wherein the interface card includes a bracket demountably connected with the connecting part.

The airflow adjustment device is set in the housing and includes a top cover, a plurality of sidewalls, a bracket plate, and at least one deflector. The sidewalls are extended from two sides of the top cover, wherein the top cover and the sidewalls can hold the interface card. The bracket plate extends from a front side of the top cover and positioned in front of the top cover to shelter the bracket, wherein the width of the bracket plate is substantially not larger than that of the top cover, and the bracket plate and at least one of the plurality of sidewalls form at least one gap area. The at least one deflector extends outward from one of the plurality of sidewalls and used to guide air flowing through the at least one gap area and entering the airflow adjustment device. When the interface card is plugged in the expansion slot, the interface card is positioned in the airflow adjustment device, thereby allowing the flow resistance of air not to be affected by the form of the bracket when air enters the airflow adjustment device through the at least one intake area and the at least one gap area.

BRIEF DESCRIPTION OF THE DRAWINGS

The above and other objectives, features, and advantages of the present invention are hereunder illustrated with specific embodiments in conjunction with the accompanying drawings and therefore rendered distinctive and comprehensible, in which.

DETAILED DESCRIPTION OF THE EMBODIMENTS OF THE INVENTION

Figure 1A:
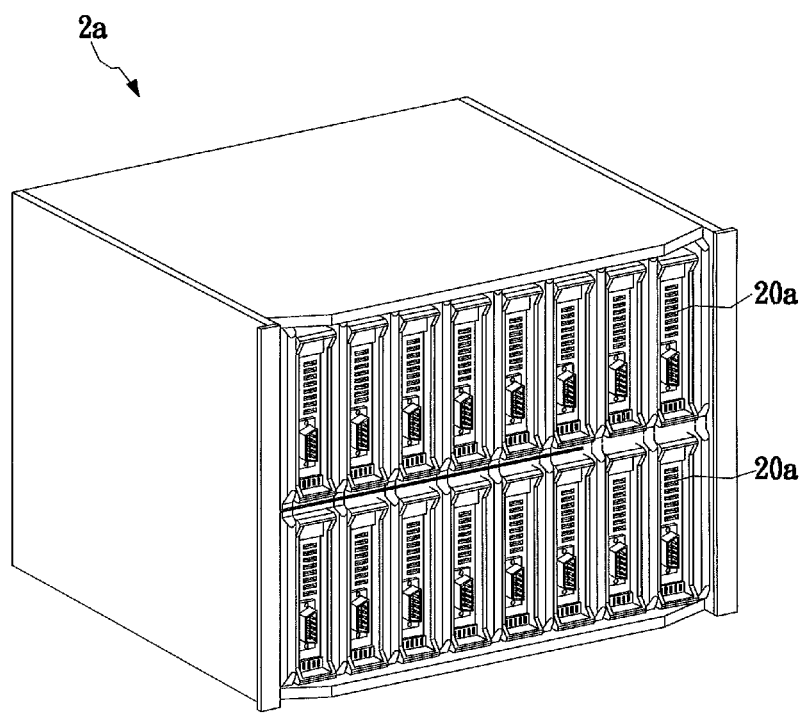
FIG. 1A is a schematic view of a prior blade server system according to a specific embodiment.
Figure 1B:
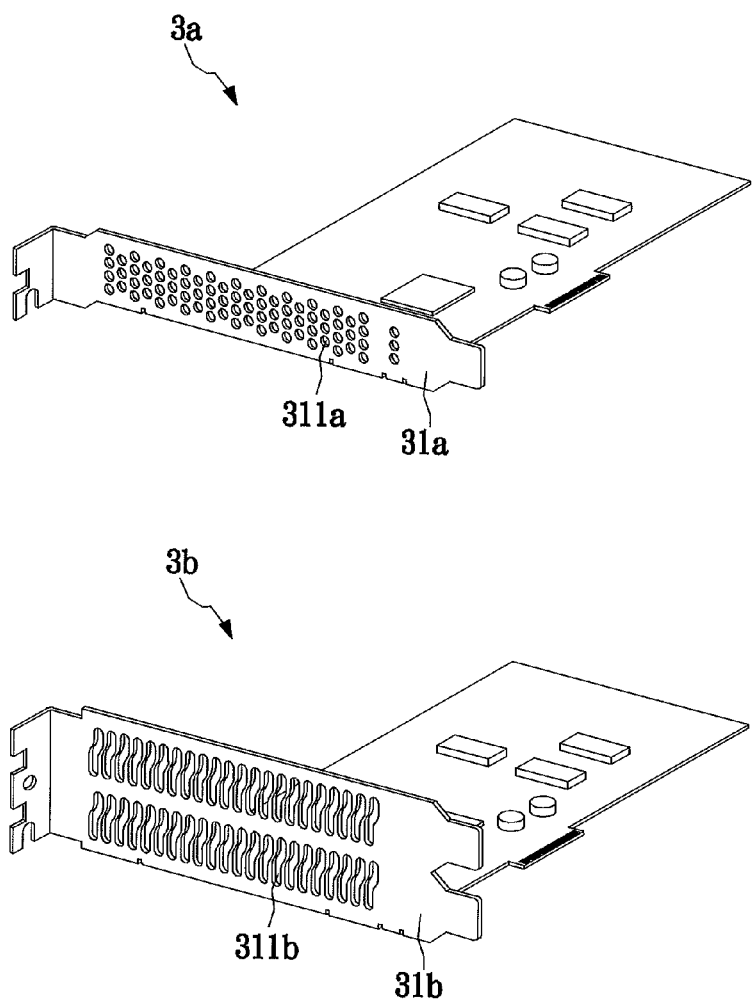
FIG. 1B is a schematic view of a prior bracket of an interface card according to two specific embodiments.
Figure 2:
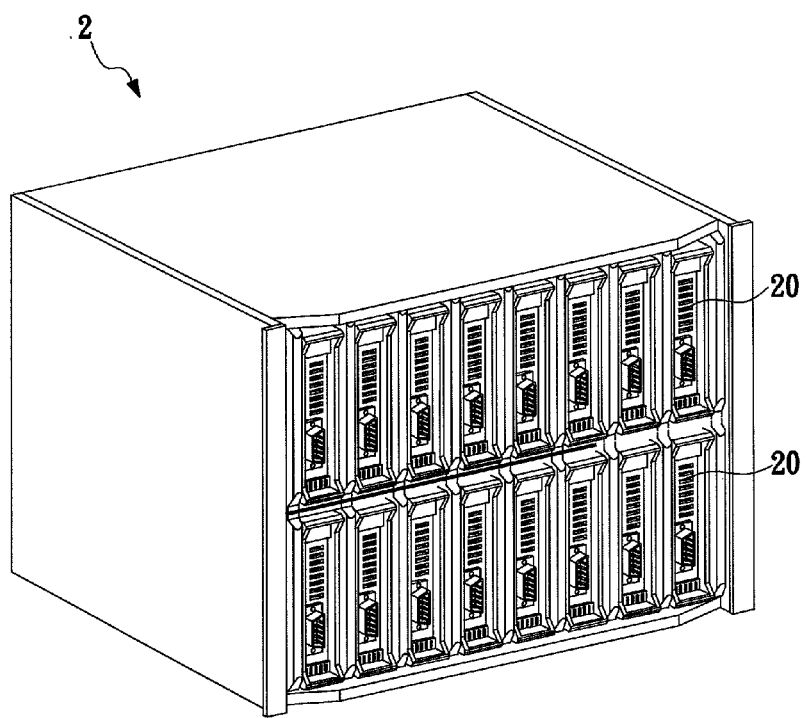
FIG. 2 is a schematic view of a blade server system according to a specific embodiment of the present invention.

Referring to FIG. 2, there is shown a schematic view of a blade server according to a specific embodiment of the present invention.

Figure 3:
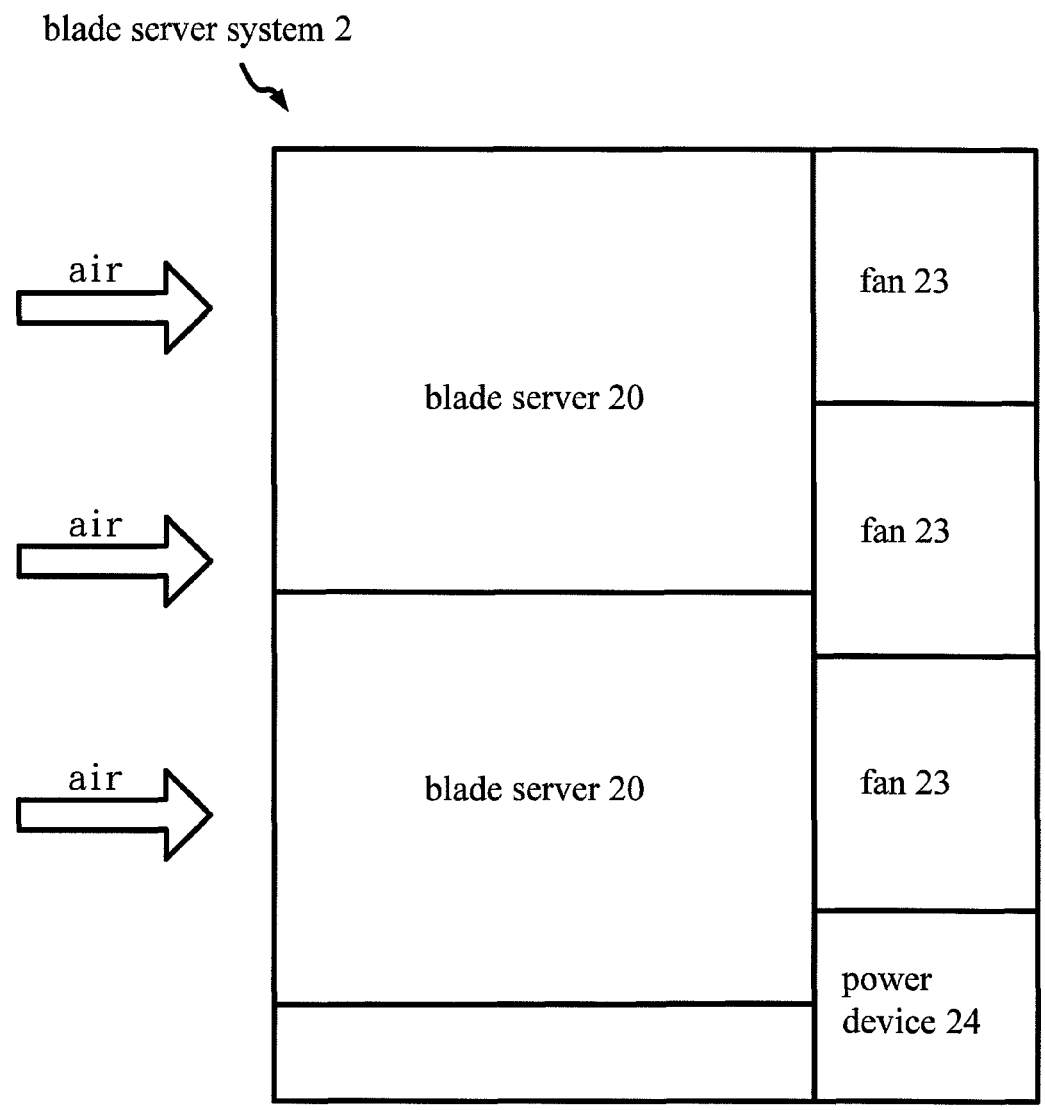
FIG. 3 is a side cross-sectional view of a blade server system according to a specific embodiment of the present invention.

As shown in FIG. 2, in a specific embodiment of the present invention, a plurality of blade servers 20 are set in a blade server system 2. As shown in FIG. 3, a plurality of fans 23 are set in the back of the blade servers 20 and used to cool each blade server 20 by guiding air in front of each blade server 20 to the back of each blade server 20, and a power device 24 is electrically connected with each blade server 20 and each fan 23, such that the power device 24 supplies power to each blade server 20 and each fan 23 for operation. Since the blade server system 2 is well known to those of reasonable skill in the art, and this is not the primary issue of the present invention, there is no need for further description.

Figure 4:
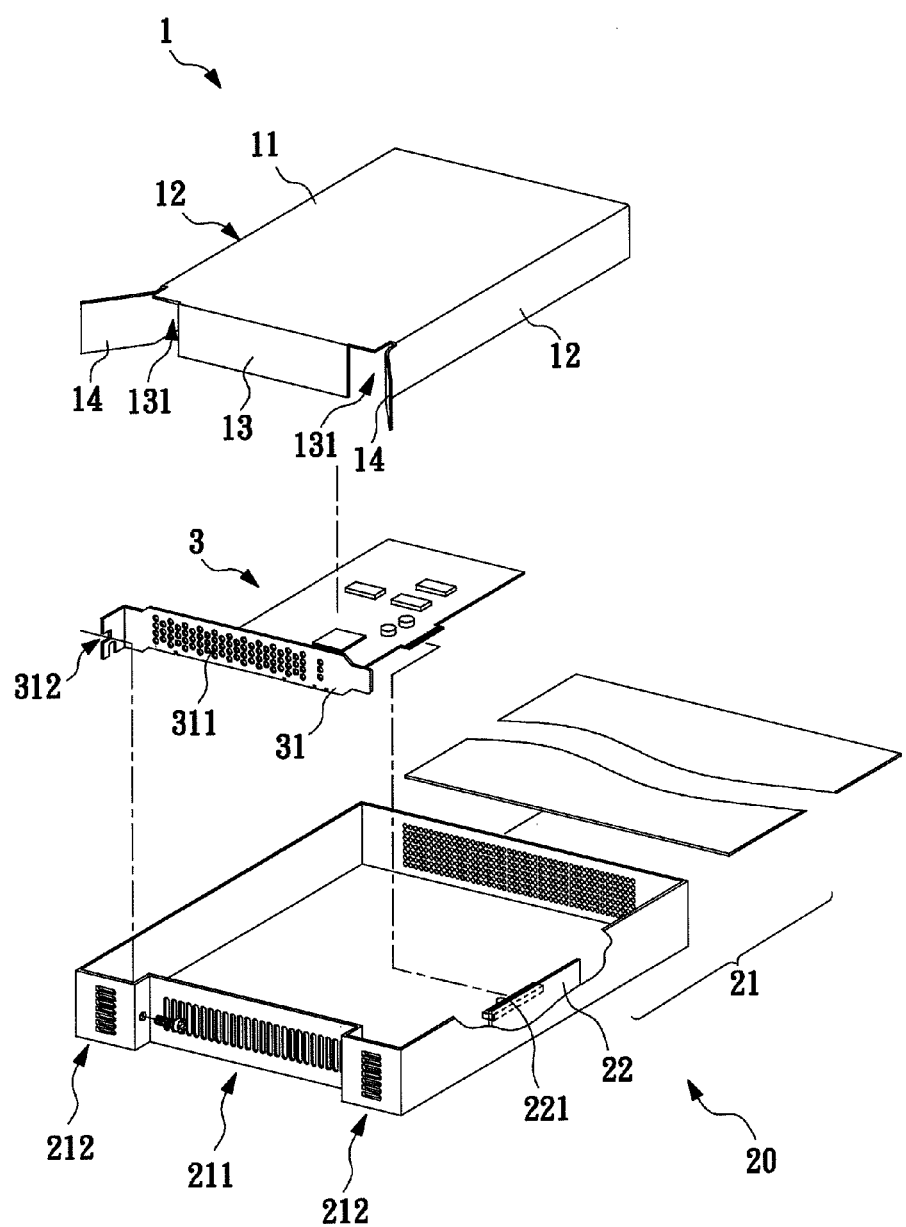
FIG. 4 is an exploded perspective view of a blade server and an airflow adjustment device according to a specific embodiment of the present invention.

As shown in FIG. 4, in a specific embodiment of the present invention, the blade server 20 is provided for plugging in an interface card 3, such that the blade server system 2 could have the function of an interface card. In a specific embodiment of the present invention, the interface card 3 is a PCI-E (PCI-Express) card, but the present invention is not limited thereto. For example, the interface card 3 may be also Peripheral Component Interconnect (PCI) interface card, Industry Standard Architecture (ISA) interface card, or any form of a network card. The interface card 3 includes a bracket 31, which includes a bracket opening 311 and a tapped hole 312. In a specific embodiment of the present invention, the bracket 31 is L-shaped, but it is not limited thereto. An additional item that should be noted is that the bracket 31 may not have the bracket opening 311 and the tapped hole 312.

The blade server 20 includes a housing 21, a circuit board 22, and an airflow adjustment device 1. The housing 21 includes a connecting part 211, two intake areas 212, and an outtake area 213. Each intake area 212 is positioned at two sides of the connecting part 211, and the outtake area 213 is positioned at the back of the housing 21. An additional item that should be noted is that the quantity and form of the intake areas 212 and the outtake areas 213 are not limited in FIG. 4. For example, each intake area 212 may be respectively positioned up and down the connecting part 211 (figure not shown). For another example, a single intake area 212 may be also positioned at the left side or right side of the connecting part 211. In a specific embodiment of the present invention, the connecting part 211 is n-shaped, but it is not limited thereto.

The circuit board 22 is mounted inside the housing 21 and includes an expansion slot 221 provided for plugging in the interface card 3. When the interface card 3 is plugged in the expansion slot 221, the bracket 31 can be installed in the housing 21, and the tapped hole 312 can be demountably connected with the connecting part 211, and the connection between the tapped hole 312 and the connecting part 211 may be coupled with a lock, but it is not limited thereto.

Figure 5:
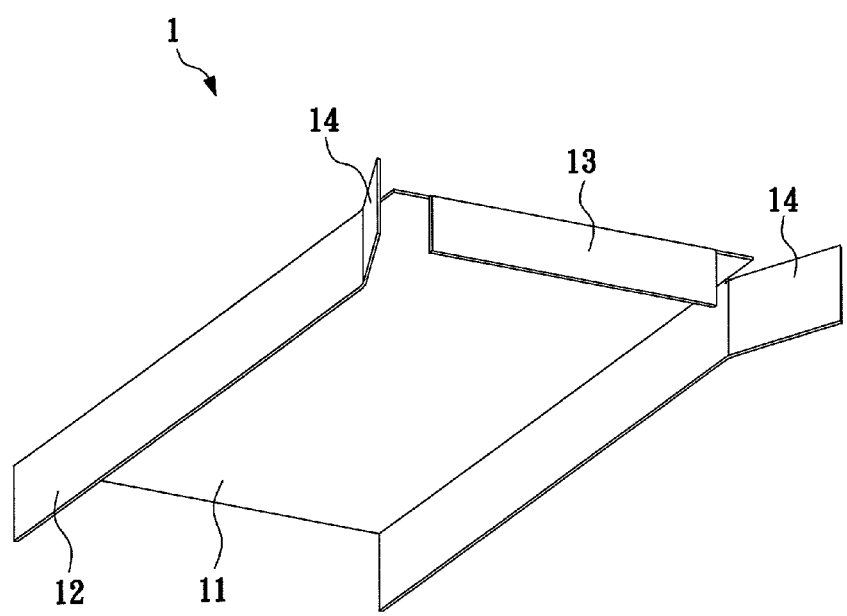
FIG. 5 is a bottom view of an airflow adjustment device according to a specific embodiment of the present invention.

The airflow adjustment device 1 is demountably set in the housing 21 and includes a top cover 11, a plurality of sidewalls 12, a bracket plate 13, and a deflector 14. The width of the top cover 11 is slightly smaller than that of the housing 21, but it is not limited thereto. The plurality of sidewalls 12 are extended from two sides of the top cover 11, wherein the top cover 11 and the plurality of sidewalls 12 can hold the interface card 3 and components thereof (as shown in FIG. 5). The bracket plate is extended from a front side of the top cover 11 to shelter the bracket 31 and a bracket opening 311 thereof, wherein the width of the bracket plate 13 is substantially not larger than the width of the top cover, and the bracket plate 13 and each sidewall 12 form two gap areas 131. To be noted is that the quantity and position of the gap areas 131 are not limited to the configuration shown in FIG. 5, and it depends on the position of the bracket plate 13. Each deflector 14 is outward extended from each sidewall to provide outside air flowing through each gap area 131 and entering the airflow adjustment device 1.

In a specific embodiment of the present invention, the material of the airflow adjustment device 1 may be metal, plastic, or paper, though the present invention is not limited thereto.

Figure 6:
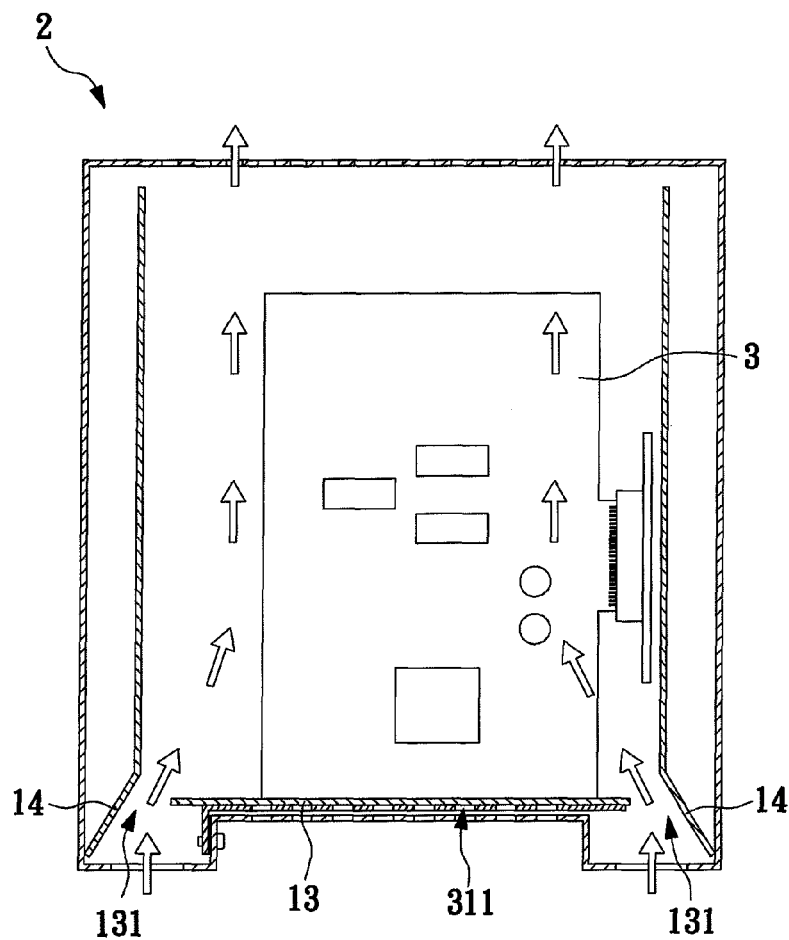
FIG. 6 is a schematic view of the flow field in the blade server according to a specific embodiment of the present invention.

Referring to FIG. 3, FIG. 4, and FIG. 6, when the fans are running, because the air on the front side of the blade server 20 is obstructed by the bracket 31, it thus only enters the housing 21 via the intake area 212 (as shown in FIG. 4), and then enters the airflow adjustment device 1 along each deflector 14 via each gap area 131, thereby allowing air to cool the interface card 3 and finally to leave via the outtake area 213. Therefore, regardless of the quantity and shape of the bracket opening 311, the airflow adjustment device 1 can adjust the variation of flow resistance to be the minimum.

Figure 7:
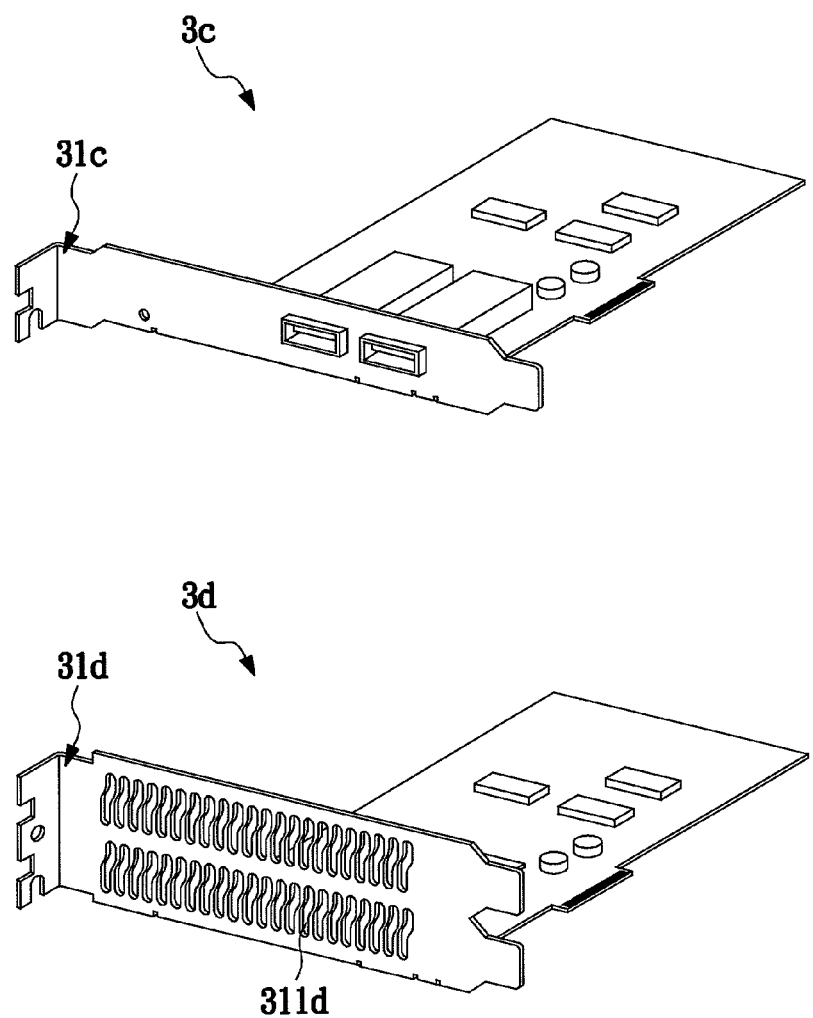
FIG. 7 is a schematic view of a bracket of an interface card according to two specific embodiments of the present invention.
Figure 8:
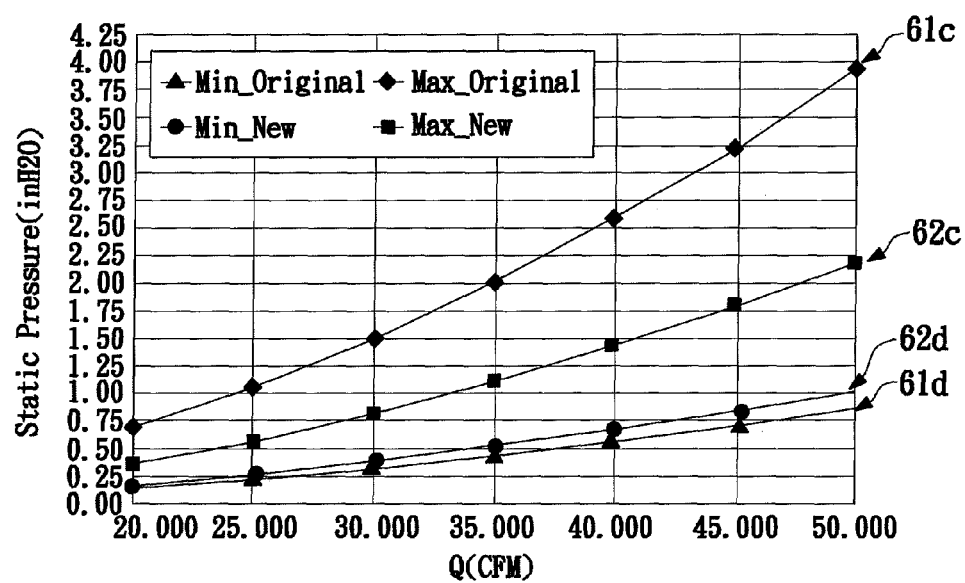
FIG. 8 is an experimental curve chart before and after adjustment of the flow field by an airflow adjustment device of the present invention.

Referring to FIG. 7 and FIG. 8, there is shown in FIG. 8 an experimental curve chart according to two different interface cards 3c, 3d separately set in the same blade server 20, as shown in FIG. 7, and after the airflow adjustment device 1 of the present invention is installed in the blade server 20, wherein the longitudinal axis is static pressure, whose unit is in $H_2O$; the horizontal axis is flux, whose unit is cubic feet per minute (CFM).

As shown in FIG. 7, the bracket 31c of the interface card 3c does not include the bracket opening, such that the flow resistance generated by the interface card 3c is greater, as shown by the flow resistance curve 61c in FIG. 8. As shown in FIG. 7, the bracket 31d of the interface card 3d includes the bracket opening 311d evenlly set in the bracket 31d, such that the flow resistance generated by the interface card 3d is less, as shown by the flow resistance curve 61d in FIG. 8. Because the flow resistance generated by the two interface cards 3c, 3d is unequal, the effect of the heat dissipation in the entire blade server will decline. However, the original flow resistance curve 61c of the interface card 3c will be adjusted to be the flow resistance curve 62c after the airflow adjustment device 1 of the present invention is set in the blade server 20, and the original flow resistance curve 61d of the interface card 3d will be adjusted to be the flow resistance curve 62d. Thus, the airflow adjustment device 1 of the present invention can greatly reduce the variation caused by the quantity and shape of the bracket openings 311 of the bracket 31 of the interface card 3.

In conclusion, the features of the present invention are completely different from those of the prior art in terms of objectives, means, and effects. However, it should be noted that the above embodiments are illustrative of the principle and effect of the present invention only, and should not be interpreted as restrictive of the scope of the present invention. Hence, persons skilled in the art can make modifications and changes to the aforesaid embodiments without violating the technical principle and spirit of the present invention. Accordingly, the extent of legal protection for the rights claimable toward the present invention should be defined by the appended claims.

What is claimed is:

1. An airflow adjustment device used for an interface card having a bracket, the airflow adjustment device comprising:
   a top cover;
   a plurality of sidewalls extending from two sides of the top cover, such that the interface card is covered by the airflow adjustment device; and
   a bracket plate extended from a front side of the top cover, wherein the bracket plate is positioned in front of the top cover to shelter the bracket, wherein a width of the bracket plate is substantially not larger than a width of the top cover, and the bracket plate and at least one of the plurality of sidewalls form at least one gap area, such that air can enter the bottom of the top cover via the at least one gap area, thereby allowing a flow resistance of the interface card not to be affected by the form of the bracket.

2. The airflow adjustment device of claim 1, further comprising at least one deflector outward extended from at least one of the plurality of sidewalls, and the at least one deflector is used to guide the air flowing through the at least one gap area and entering into the airflow adjustment device.

3. The airflow adjustment device of claim 2, wherein a quantity of the at least one deflector is two, and each deflector extends outward from each sidewall.

4. The airflow adjustment device of claim 1, wherein the interface card comprises a peripheral component interconnect (PCI) interface card or a PCI-E (PCI-Express) interface card.

5. A blade server adapted to install an interface card having a bracket, the blade server comprising:
   a housing, comprising:
      a connecting part for detachably connecting with the bracket; and
      at least one intake area positioned on at least one side of the connecting part;
   a circuit board positioned inside the housing, wherein the circuit board comprises an expansion slot for plugging in the interface card; and
   an airflow adjustment device positioned inside the housing, wherein the airflow adjustment device comprises:
      a top cover;
      a plurality of sidewalls extending from two sides of the top cover, such that the interface card is covered by the airflow adjustment device ; and
      a bracket plate extending from a front side of the top cover, wherein the bracket plate is positioned in front of the top cover to shelter the bracket, wherein a width of the bracket plate is substantially not larger than a width of the top cover, and the bracket plate and at least one of the plurality of sidewalls form at least one gap area;
   whereby the interface card is covered with the airflow adjustment device when the interface card is plugged into the expansion slot, thereby allowing the flow resistance of the blade server not to be affected by the form of the bracket when air enters into the airflow adjustment device via the at least one intake area and the at least one gap area.

6. The blade server of claim 5, wherein the airflow adjustment device further comprises at least one deflector extending outward from at least one of the plurality of sidewalls, and the at least one deflector is used to guide the air flowing through the at least one gap area and entering into the airflow adjustment device.

7. The blade server of claim 6, wherein a quantity of the at least one deflector is two, and each deflector extends outward from each sidewall.

8. The blade server of claim 5, wherein the interface card comprises a peripheral component interconnect (PCI) interface card or a PCI-E (P CI-Express) interface card.

9. The airflow adjustment device of claim 2, wherein the interface card comprises a peripheral component interconnect (PCI) interface card or a PCI-E (PCI-Express) interface card.

10. The blade server of claim 6, wherein the interface card comprises a peripheral component interconnect (PCI) interface card or a PCI-E (PCI-Express) interface card.

* * * * *